(12) United States Patent
Paek et al.

(10) Patent No.: US 6,987,319 B1
(45) Date of Patent: *Jan. 17, 2006

(54) WAFER-LEVEL CHIP-SCALE PACKAGE

(75) Inventors: Jong Sik Paek, Seoul (KR); In Bae Park, Seoul (KR); Seong Min Seo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/006,210

(22) Filed: Dec. 6, 2004

Related U.S. Application Data

(63) Continuation of application No. 10/285,978, filed on Nov. 1, 2002, now Pat. No. 6,841,874.

(51) Int. Cl.
*H01L 23/485* (2006.01)
*H01L 21/60* (2006.01)

(52) U.S. Cl. .............................. 257/738; 257/E23.021; 438/615

(58) Field of Classification Search ................ 257/738, 257/780, E23.021; 438/613, 615
See application file for complete search history.

(56) References Cited

U.S. PATENT DOCUMENTS

| | | | | |
|---|---|---|---|---|
| 5,858,149 A | 1/1999 | Seo et al. | ............... | 156/150 |
| 5,908,317 A | 6/1999 | Heo | ............... | 438/617 |
| 5,915,169 A | 6/1999 | Heo | ............... | 438/118 |
| 5,977,632 A | 11/1999 | Beddingfield | ............... | 257/737 |
| 6,091,141 A | 7/2000 | Heo | ............... | 257/704 |
| 6,287,893 B1 | 9/2001 | Elenius et al. | ............... | 438/108 |
| 6,387,795 B1 | 5/2002 | Shao | ............... | 438/613 |
| 6,414,390 B2 | 7/2002 | Nozawa | ............... | 257/737 |
| 6,441,487 B2 | 8/2002 | Elenius et al. | ............... | 257/738 |
| 6,445,069 B1 | 9/2002 | Ling et al. | ............... | 257/738 |
| 6,459,125 B2 | 10/2002 | Maeda et al. | ............... | 257/347 |
| 6,462,426 B1 | 10/2002 | Kelkar et al. | ............... | 257/781 |
| 6,593,220 B1 | 7/2003 | Yu et al. | ............... | 438/612 |
| 6,841,874 B1 * | 1/2005 | Paek et al. | ............... | 257/738 |
| 2002/0140069 A1 | 10/2002 | Lee et al. | ............... | 257/678 |
| 2003/0214036 A1 | 11/2003 | Sarihan et al. | ............... | 257/738 |

* cited by examiner

*Primary Examiner*—Stephen W. Smoot
(74) *Attorney, Agent, or Firm*—Gunnison, McKay & Hodgson, L.L.P.; Serge J. Hodgson

(57) ABSTRACT

A wafer-level chip-scale package includes a semiconductor die having planar top and bottom surfaces and a plurality of metal pads formed at the top surface in an area array. A first protective layer is formed on the top surface of the semiconductor die, the first protective layer having a plurality of first apertures for allowing the metal pads to be opened upward. A second protective layer is formed on a surface of the first protective layer, the second protective layer having a plurality of second apertures which are larger than and overly corresponding first apertures of the first protective layer so that regions of the metal pads and the first protective layer are exposed to the outside of the semiconductor die. Solder balls are fused to each metal pad, which are opened to the outside through the first apertures of the first protective layer and the second apertures of the second protective layer.

20 Claims, 13 Drawing Sheets

WAFER-LEVEL CHIP-SCALE PACKAGE

This application is a continuation of U.S. patent application Ser. No. 10/285,978, filed on Nov. 1, 2002, entitled "WAFER-LEVEL CHIP-SCALE PACKAGE", now U.S. Pat. No. 6,841,874, issued Jan. 11, 2005.

BACKGROUND OF THE INVENTION

1. Field of the Invention

The present invention relates generally to packaging of electronic components. More particularly, the present invention relates to wafer-level chip-scale packaging of electronic components.

2. Description of Related Art

Generally, a wafer-level chip-scale package is a semiconductor package in which the size of a finished package is similar to or slightly larger than a semiconductor die. After completion of all assembling processes or packaging processes, individual semiconductor packages are separated from a wafer having a plurality of semiconductor dies.

In this wafer-level chip-scale package, a plurality of bond pads formed on the semiconductor die is redistributed through conventional redistribution processes involving a redistribution layer (RDL) into a plurality of metal pads in an area array type. The metal pads are solder wettable surfaces, e.g. copper (Cu), nickel (Ni) or its equivalent. Solder balls are directly fused on the metal pads, which are formed in the area array type by means of the redistribution process. A protective layer, which is thicker than an oxide film ($SiO_2$) (or a nitride film ($Si_3N_4$) and TEOS (Tetra Ethyl Ortho Silicate)), is formed at the entire surface of the semiconductor die except at apertures in the protective layer at the metal pads so as to positively protect the surface of the semiconductor die from the external environment and to easily perform the solder ball bumping and fusing process. That is, the protective layer is formed in such a manner that the thickness of the protective layer is thicker than the oxide film, and then the solder balls are bumped and fused on the metal pads, which are open upward through the protective layer prior to solder ball bumping. Since the protective layer is formed on the surface of the oxide layer, the opening size to the metal pads becomes smaller.

More recently, there are occasions in which, after forming the protective layer (hereinafter, referred to as 'a first protective layer') on the upper surface of the semiconductor die, metal lines for a variety of passive elements, such as resistors, inductors and capacitors, are further formed on the surface of the first protective layer, in order to implement, for example, Integrated Passive Networks (IPN) functions. The metal lines for the passive elements are connected to semiconductor die directly or indirectly via the RDL metal lines, which are formed at a lower part of the first protective layer. At this time, in order to prevent an electrical interaction between the metal lines for the passive elements and other metal lines, for example the RDL metal lines formed on a lower part of the first protective layer of the semiconductor die, the first protective layer is relatively thickly formed. A second protective layer can be relatively thickly formed at the surface of the first protective layer in order to protect the metal lines for the passive elements. At this time, the metal pads are also open to the outside through the second protective layer.

However, as the exposed region of the first protective layer is covered with the second protective layer, the size of the opening to the metal pads is decreased. That is, since the second protective layer is formed on the top surface of the first protective layer, the opening size formed through the second protective layer to the metal pads becomes much smaller than that formed through the first protective layer to the metal pads. Accordingly, where the overall opening size to the metal pads decreases, the contact area of the solder ball that is fused to the metal pad becomes smaller and the density of electric currents flowing through it becomes larger, thereby deteriorating the reliability of the package. Also, because the opening size to the metal pads becomes smaller, it is necessary for the solder balls to be bumped very precisely on the metal pads, thereby the rate of inferior goods increases and the production yield of the semiconductor package is remarkably decreased.

SUMMARY OF THE INVENTION

A wafer-level chip-scale package includes a semiconductor die having approximately planar top and bottom surfaces and a plurality of metal pads formed through a redistribution process in an area array at the top surface of the semiconductor die. A first protective layer of a predetermined thickness is formed on the top surface of the semiconductor die, the first protective layer having a plurality of first apertures of a predetermined size therethrough allowing the metal pads to be opened, sometimes called exposed, upward. A second protective layer of a predetermined thickness is formed on the first protective layer, the second protective layer having a plurality of second apertures therethrough, which are larger than the first apertures through the first protective layer, allowing predetermined regions of the metal pads and the first protective layer to be exposed to the outside of the semiconductor die. A plurality of solder balls is then fused to each exposed region of the metal pads, which, as noted, are open to the outside through the first apertures in the first protective layer and the second apertures in the second protective layer.

The present invention is best understood by reference to the following detailed description when read in conjunction with the accompanying drawings.

BRIEF DESCRIPTION OF THE DRAWINGS

Common reference numerals are used throughout the drawings and detailed descriptions to indicate like elements.

DETAILED DESCRIPTION

Figure 1A:
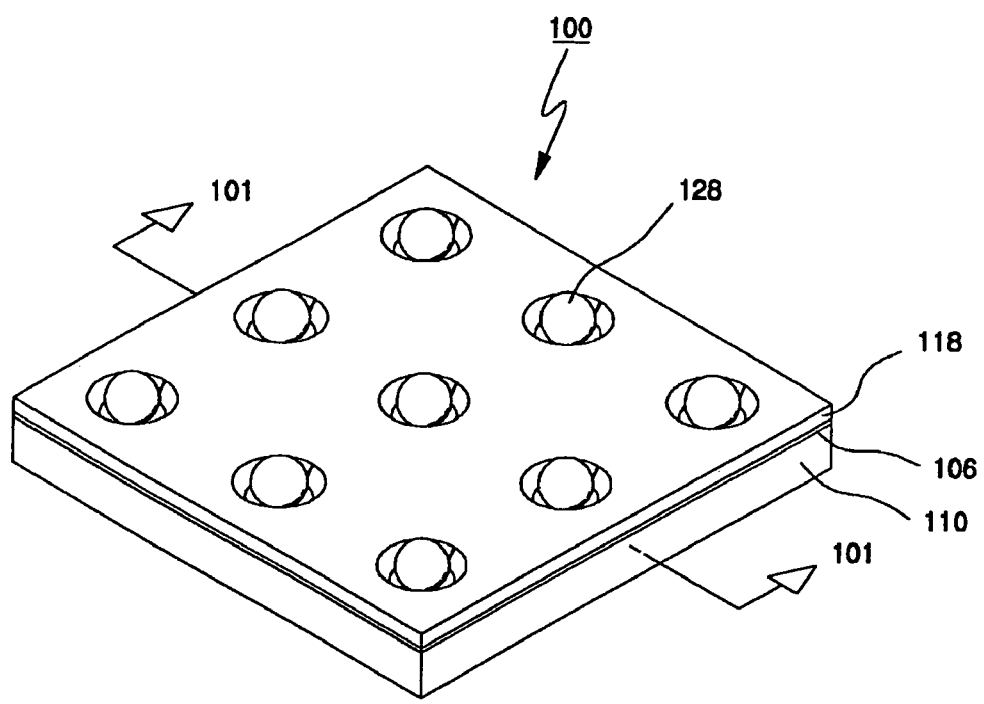
FIG. 1A is a perspective view illustrating a wafer-level chip-scale package according to one embodiment of the present invention.
Figure 1B:
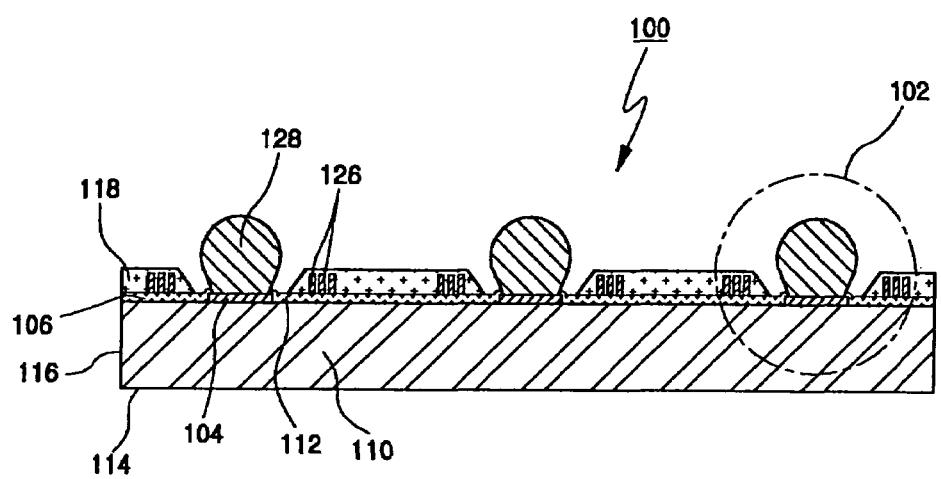
FIG. 1B is a sectional view taken along the line 101—101 of FIG. 1A.
Figure 1C:
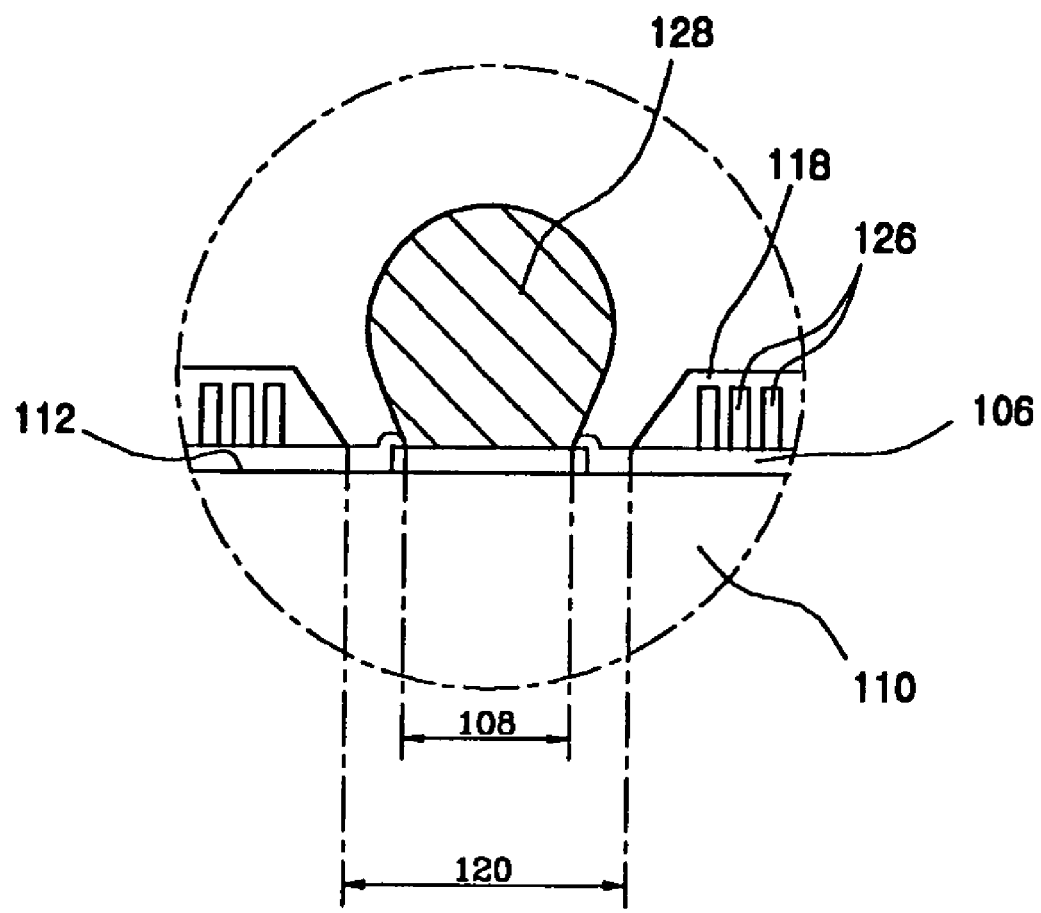
FIG. 1C is an enlarged sectional view corresponding to portion "102" of FIG. 1B.

Referring to FIG. 1A, a wafer-level chip-scale package 100 according to one embodiment of the present invention is illustrated; referring to FIG. 1B, a sectional view taken along the line 101—101 of FIG. 1A is illustrated; and referring to FIG. 1C, an enlarged sectional view corresponding to a portion "102" of FIG. 1B is illustrated.

As shown in the drawings, the wafer-level chip-scale package 100 according to one embodiment of the present invention includes a semiconductor die 110 having a first protective layer 106 of a predetermined thickness at a top surface 112 of the semiconductor die 110 and a plurality of metal pads 104 opened upward through apertures 108 in the first protective layer 106; a plurality of metal lines 126 for passive elements (not shown) formed on the first protective layer 106; a second protective layer 118 of a predetermined thickness formed on the first protective layer 106 for covering the metal lines 126, parts of the metal pads 104 and the first protective layer 106 being opened upward through apertures 120 in the second protective layer 118; and a plurality of solder balls 128 fused to the exposed parts of metal pads 104.

More particularly, the semiconductor die 110 includes the top surface 112 and a bottom surface 114, both of an approximately planar shape, and a side surface 116 perpendicular to the top and bottom surfaces 112 and 114 at each of their ends. Also, the plurality of metal pads 104 is formed on the top surface 112 of the semiconductor die 110 and the plurality of first apertures 108 of a predetermined size is formed through first protective layer 106 at the top surface 112 in order to allow the metal pads 104 to be opened upward. The metal pads 104 are solder wettable surfaces, e.g. copper (Cu), nickel (Ni) or its equivalent. Moreover, the first protective layer 106 of a predetermined thickness is formed on the top surface 112 of the semiconductor die 110 in order to protect the top surface 112 of the semiconductor die 110 from external mechanical, electrical and chemical environments, etc. Here, the material of the first protective layer 106 may be any material such as oxide film, nitride film, TEOS (Tetra Ethyl Ortho Silicate), BCB (Benzo Cyclo Butene), polyimide or its equivalent. However, the present invention is not limited to any material of the first protective layer.

The plurality of metal lines 126 is formed on the surface of the first protective layer 106. In this case, the first protective layer 106 has enough thickness to allow the metal lines 126 and other metal lines (not shown), formed at a lower part of the first protective layer 106, not to electrically interfere with each other. Here, the material of the metal lines 126 may be conventional copper (Cu), aluminum (Al) or its equivalent. However, the present invention is not limited to any material of the metal lines. Also, the metal lines 126 serves as passive elements such as a resistor, inductor or capacitor and so forth. The metal lines 126 for the passive elements are connected to semiconductor die 110 directly or indirectly by the RDL metal lines (not shown), which are formed at a lower part of the first protective layer 106, with, for example, vias through the first protective layer.

The second protective layer 118, also of a predetermined thickness, is formed on the first protective layer 106. The second protective layer 118 includes a plurality of second apertures 120, which are larger than the first apertures 108 of the first protective layer 106, so that predetermined regions of the metal pads 104 and the first protective layer 106 are exposed to the outside of semiconductor die 110. Accordingly, in one embodiment, the first protective layer 106 is exposed to the outside in an approximately circular ring shape from a plan point of view through the second aperture 120 of the second protective layer 118.

The solder balls are fused to each metal pad 104, which are exposed to the outside through the first apertures 108 of the first protective layer 106. Accordingly, the solder balls 128 are contacted with only the first apertures 108 of the first protective layer 106 and the metal pads 104. However, the solder balls 128 are separate from and are not in contact with the second protective layer 118. More particularly, parts of the first protective layer 106 are exposed to the outside in an approximately circular ring shape from a plan point of view through the second aperture 120 of the second protective layer 118, even after the solder balls 128 are fused to the metal pads 104.

Figure 2A:
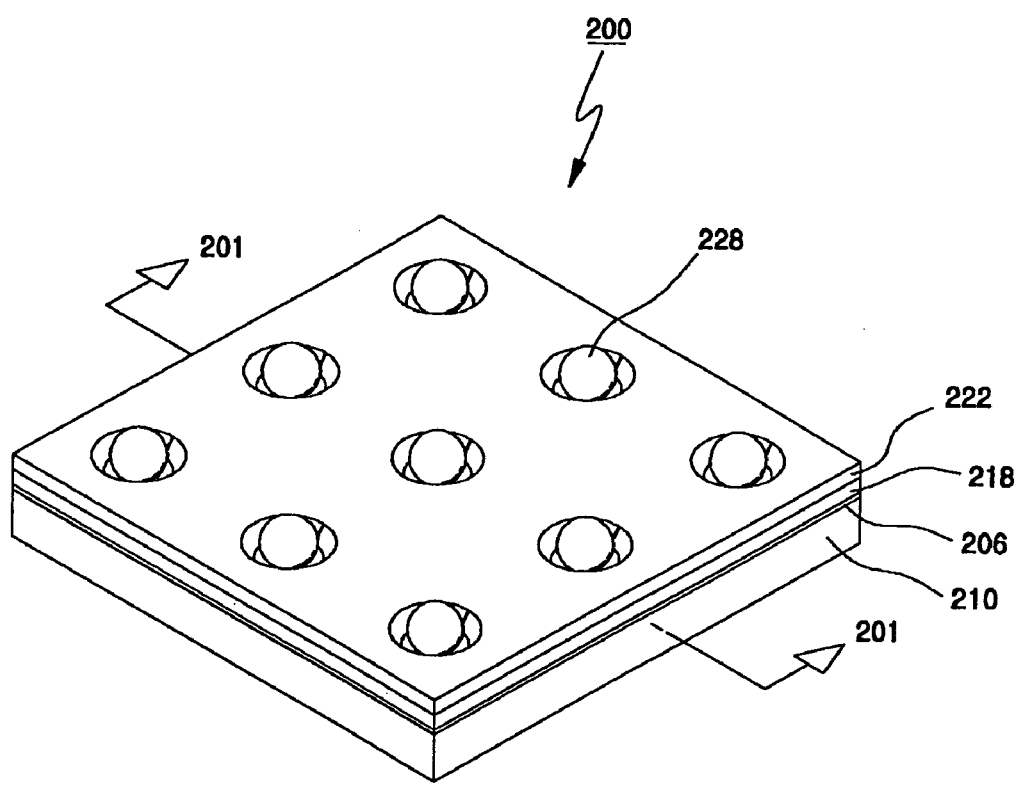
FIG. 2A is a perspective view illustrating a wafer-level chip-scale package according to another embodiment of the present invention.
Figure 2B:
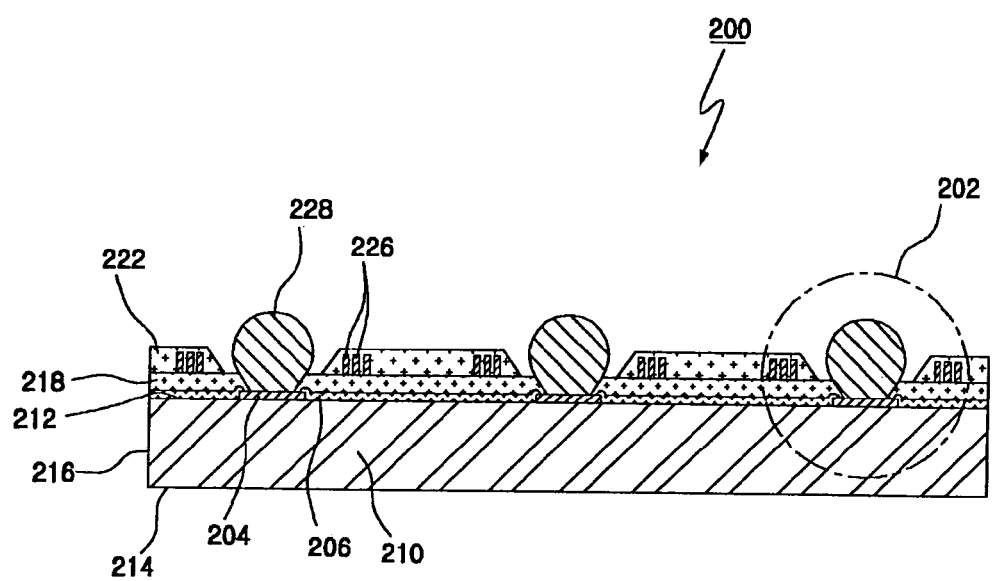
FIG. 2B is a sectional view taken along the line 201—201 of FIG. 2A.
Figure 2C:
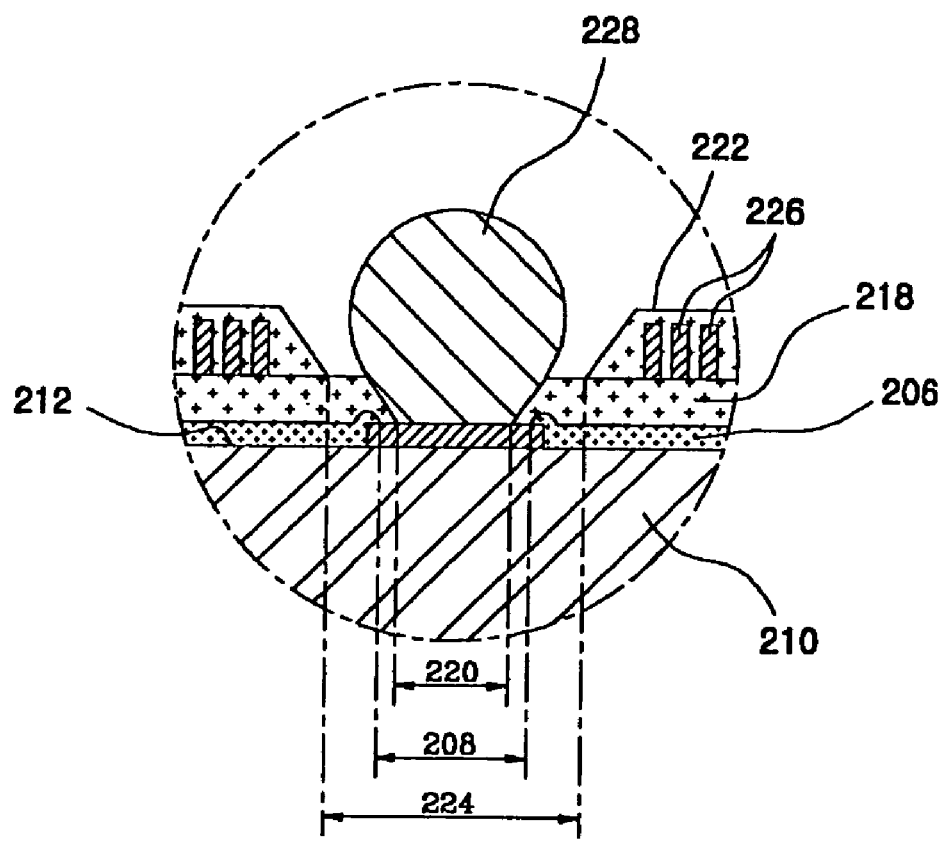
FIG. 2C is an enlarged sectional view corresponding to a portion "202" of FIG. 2B.

Referring to FIG. 2A, a wafer-level chip-scale package 200 according to another embodiment of the present invention is illustrated; referring to FIG. 2B, a sectional view taken along the line 201—201 of FIG. 2A is illustrated; and referring to FIG. 2C, an enlarged sectional view corresponding to a portion "202" of FIG. 2B is illustrated.

As shown in the drawings, the wafer-level chip-scale package 200 according to another embodiment of the present invention includes a semiconductor die 210 having a first protective layer 206 of a predetermined thickness at a top surface 212 of the semiconductor die 210 and a plurality of metal pads 204 which are opened upward through apertures 208 in the first protective layer 206, a second protective layer 218 of a predetermined thickness formed on the surface of the first protective layer 206 so as to allow the metal pads 204 to be exposed through apertures 220 in the second protective layer 218, a plurality of metal lines 226 for passive elements (not shown) formed on the second protective layer 218, a third protective layer 222 of a predetermined thickness formed on the second protective layer 218 for covering the metal lines 226, parts of the metal pads 204 and the second protective layer 218 being opened upward through apertures 224 in the third protective layer 222, and a plurality of solder balls 228 fused to the exposed parts of metal pads 204.

More particularly, the semiconductor die 210 includes the top surface 212 and a bottom surface 214, both of an approximately planar shape, and a side surface 216 perpendicular to the top and bottom surfaces 212 and 214 at their ends. Also, the plurality of metal pads 204 is formed on the top surface 212 of the semiconductor die 210 and a plurality of first apertures 208 of a predetermined size is formed through the first protective layer 206 at the top surface 212 in order to allow the metal pads 204 to be opened upward. The metal pads 204 are solder wettable surfaces, e.g. copper (Cu), nickel (Ni) or its equivalent. Moreover, the first protective layer 206 of a predetermined thickness is formed on the top surface 212 of the semiconductor die 210 in order to protect the top surface 212 of the semiconductor die 210 from external mechanical, electrical and chemical environments, etc. Here, the material of the first protective layer 206 may be any material such as oxide film, nitride film, TEOS, BCB, polyimide or its equivalent. However, the present invention is not limited to any material of the first protective layer.

The second protective layer 218 of a predetermined thickness is formed on partial regions of the first protective layer 206 and the metal pads 204. The second protective layer 218 includes a plurality of second apertures 220 therethrough and having a predetermined diameter for allowing the metal pads 204 to be opened upward. Here, since the second protective layer 218 is formed on the first protective layer 206 as well as on the metal pads 204, the second apertures 220 of the second protective layer 218 are smaller than the first apertures 208 of the first protective layer 206. Accordingly, the opening size to the metal pads 204 is somewhat decreased. The material of the second protective layer 218 also may be any material such as oxide film, nitride film, TEOS, BCB, polyimide or its equivalent. However, the present invention is not limited to any material of the second protective layer.

The plurality of metal lines 226 is formed on the surface of the second protective layer 218. The material of the metal lines 226 may be conventional copper (Cu), aluminum (Al) or its equivalent. However, the present invention is not limited to any material of the metal lines. Also, the metal lines 226 serve as passive elements such as a resistor, inductor or capacitor and so forth. The metal lines 226 for the passive elements are connected to semiconductor die 210 directly or indirectly via the RDL metal lines (not shown), which are formed at a lower part of the first protective layer 206.

The third protective layer 222, also of a predetermined thickness, is formed on the second protective layer 218. The third protective layer 222 includes a plurality of third apertures 224, which are larger than the second apertures 220 of the second protective layer 218, in order that predetermined regions of the metal pads 204 and the second protective layer 218 are exposed to the outside of semiconductor die 210. Here, the material of the third protective layer 222 also, may be any material such as oxide film, nitride film, TEOS, BCB, polyimide or its equivalent. However, the present invention is not limited to any material of the third protective layer.

The third aperture 224 of the third protective layer 222 is larger than the first aperture 208 of the first protective layer 206 and the second aperture 220 of the second protective layer 218. The second aperture 220 of the second protective layer 218 is smaller than the first aperture 208 of the first protective layer 206 as described above. Accordingly, in one embodiment, parts of the metal pads 204 and a partial region of the second protective layer 218 are opened to the outside through the third aperture 224 of the third protective layer 222 and the second protective layer 218 is exposed to the outside in an approximately circular ring shape from a plan point of view through the third aperture 224 of the third protective layer 222.

The solder balls 228 are fused to each of metal pads 204, which were exposed to the outside through the second apertures 220 of the second protective layer 218. Accordingly, the solder balls 228 are contacted with only the second apertures 220 of the second protective layer 218 and the metal pads 204. However, in one embodiment, the solder balls 228 are separated from and are not in contact with the third protective layer 222. More particularly, parts of the second protective layer 218 are exposed to the outside in an approximately circular ring shape from a plan point of view through the third aperture 224 of the third protective layer 222, even after the solder balls 228 are fused to the metal pads 204.

A method for manufacturing the wafer-level chip-scale package 100 according to one embodiment of the present invention will be described in a stepwise manner with reference to FIGS. 3A through 3F. Referring to FIG. 3A through FIG. 3F, the process flow for constructing the embodiment illustrated by FIG. 1A through FIG. 1C is discussed.

Figure 3A:
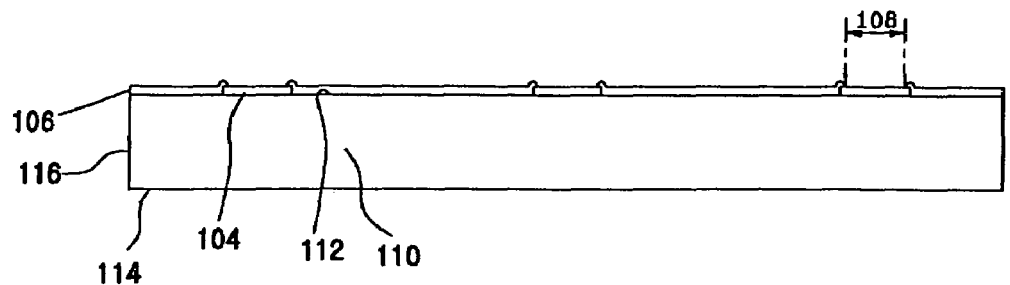
FIG. 3A is a sectional view illustrating a first protective layer-forming step among the manufacturing processes of a wafer-level chip-scale package according to one embodiment of the present invention.

Firstly, referring to FIG. 3A, a step of forming a first protective layer 106 among the manufacturing processes of a wafer-level chip-scale package according to one embodiment of the present invention is illustrated.

As shown in FIG. 3A, a semiconductor die 110 including top and bottom surfaces 112 and 114 of an approximately planar shape and a plurality of metal pads 104 formed at the top surface 112 is provided. Also, the semiconductor die 110 further comprises the first protective layer 106 of a predetermined thickness formed on the top surface 112 of the semiconductor die 110, the first protective layer 106 having first apertures 108 of a predetermined size for allowing the metal pads 104 to be opened upward. For example, after the first protective layer 106 is formed over the entire top surface 112 of the semiconductor die 110, regions of the first protective layer 106 overlying metal pads 104 are etched so that the first apertures 108 of a predetermined size are formed through first protective layer 106 at the top surface 112 thereby allowing the corresponding metal pads 104 to be opened upward through first apertures 108. As used herein, metal pad 104 is corresponding with the first aperture 108 if the region etched in first protective layer 106 to form a first aperture 108 overlies a metal pad 104 and a first aperture 108 formed by the etching of first protective layer 106 at least partially exposes an overlain metal pad 104 to the outside. The material of the first protective layer 106 may be any material such as oxide film, nitride film, TEOS, BCB, polyimide or its equivalent. However, the present invention is not limited to any material of the protective layer.

Figure 3B:
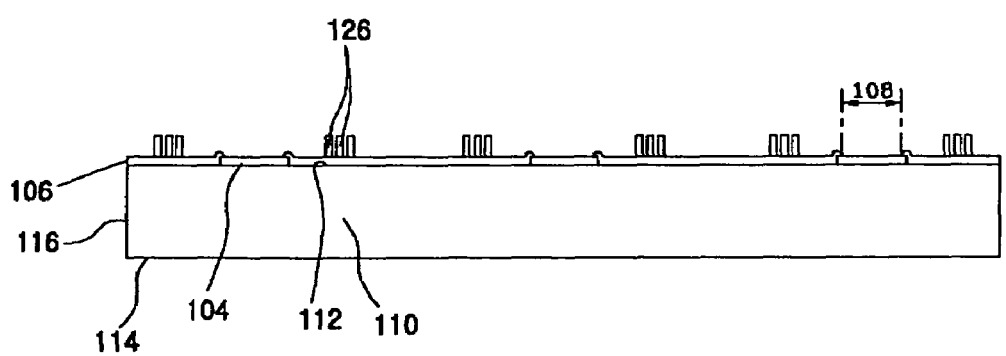
FIG. 3B is a sectional view illustrating a step of forming metal lines for a passive element among the manufacturing processes of a wafer-level chip-scale package according to one embodiment of the present invention.

Next, referring to FIG. 3B, a step of forming metal lines 126 for a passive element among the manufacturing processes of a wafer-level chip-scale package according to one embodiment of the present invention for implementing, for example, IPN functions is illustrated.

As shown in FIG. 3B, a plurality of metal lines 126 for passive elements (not shown) such as a resistor, inductor or capacitor is formed on the surface of the first protective layer 106. The metal lines 126 can be formed by a conventional photo etching process, after a copper (Cu) or aluminum (Al) and so forth are evaporated on the surface of the first protective layer 106. The metal lines 126 for the passive elements are connected to semiconductor die 110 directly or indirectly via the RDL metal lines, which are formed at a lower part of the first protective layer 106.

Figure 3C:
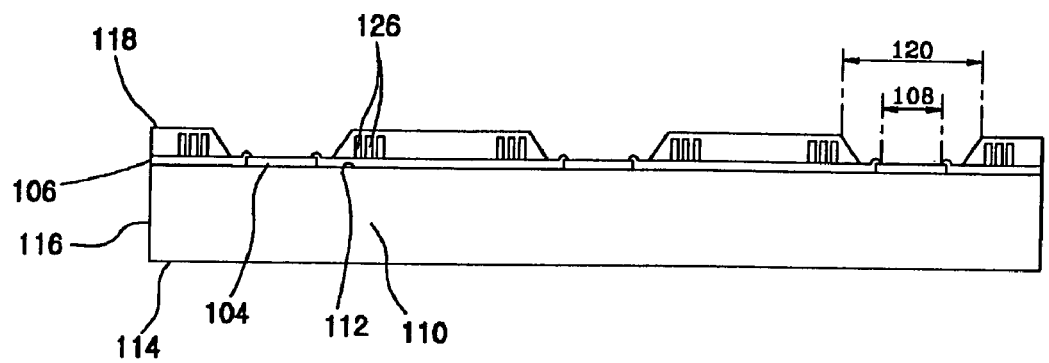
FIG. 3C is a sectional view illustrating a second protective layer-forming step among the manufacturing processes of a wafer-level chip-scale package according to one embodiment of the present invention.

Referring to FIG. 3C, a step that describes the forming a second protective layer 118 among the manufacturing processes of a wafer-level chip-scale package according to one embodiment of the present invention is illustrated.

As shown in FIG. 3C, a second protective layer 118 of a predetermined thickness is formed on the first protective layer 106. The second protective layer 118 includes a plurality of second apertures 120 for allowing predetermined regions of the metal pads 104 and the first protective layer 106 to be opened upward through apertures 120 in second protective layer 118. The second protective layer 118, like the first protective layer 106 may be any material such as oxide film, nitride film, TEOS, BCB, polyimide or its equivalent. However, the present invention is not limited to any material of the first protective layer. Here, the second protective layer 118 has enough thickness to cover the metal lines 126. After the second protective layer 118 of a predetermined thickness is formed at the whole top surfaces of the first protective layer 106 and the metal pads 104, the second protective layer 118 is further formed in such a manner that predetermined regions of the second protective layer 118 overlying corresponding metal pads 104 and the first apertures 108 of the first protective layer 106 are etched. Accordingly, the plurality of metal pads 104 is exposed to the outside through the second apertures 120 etched in the second protective layer 118. In addition, the first protective layer 106 is exposed to the outside in an approximately circular ring shape from a plan point of view through the second aperture 120 of the second protective layer 118.

Figure 3D:
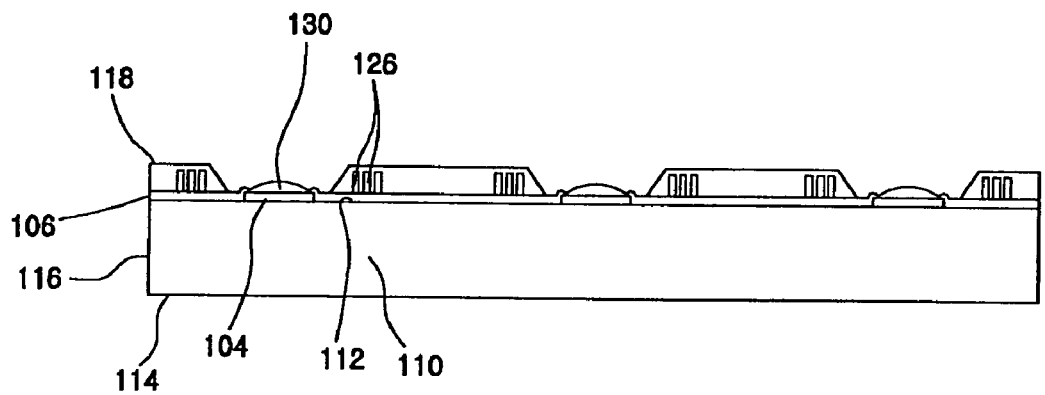
FIG. 3D is a sectional view illustrating a flux-dotting step among the manufacturing processes of a wafer-level chip-scale package according to one embodiment of the present invention.

Referring to FIG. 3D, a flux-dotting step among the manufacturing processes of a wafer-level chip-scale package according to one embodiment of the present invention is illustrated.

As shown in FIG. 3D, a uniform amount of viscous volatile flux 130 is dotted on each of the metal pads 104, which are opened to the outside through the second aperture 120 of the second protective layer 118. This flux dotting process is performed by a conventional dispenser, which contains the flux 130.

Figure 3E:
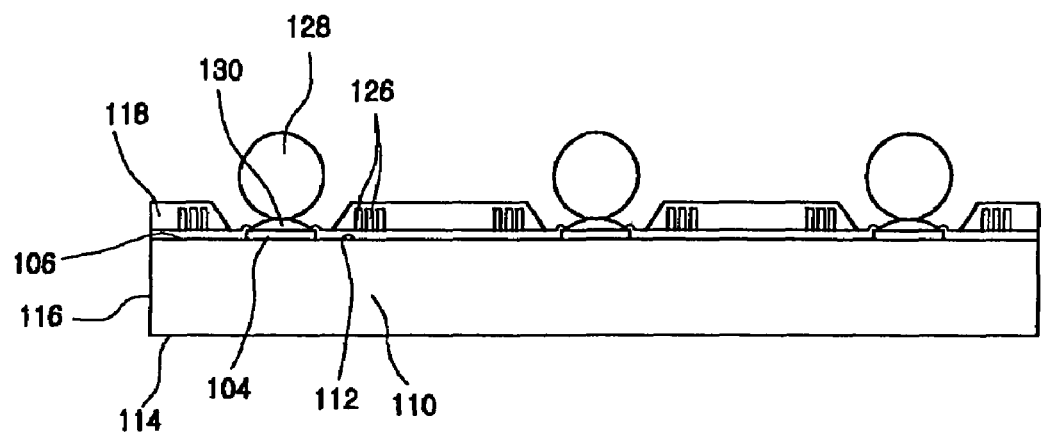
FIG. 3E is a sectional view illustrating a solder ball-bumping step among the manufacturing processes of a wafer-level chip-scale package according to one embodiment of the present invention.

Referring to FIG. 3E, a solder ball 128 bumping step among the manufacturing processes of a wafer-level chip-scale package according to one embodiment of the present invention is illustrated.

As shown in FIG. 3E, a plurality of circular solder balls 128 is bumped on the upper part of the dotted flux 130. Here, since the flux 130 in itself has viscosity, the flux temporarily fixes the solder ball 128. Also, the second aperture 120 of the second protective layer 118 is larger than the first aperture 108, thereby allowing the solder ball 128 to be guided inside the first aperture 108. Accordingly, the solder ball 128 is easily bumped on the flux 130 inside the first aperture 108, although the solder ball is bumped only loosely.

Figure 3F:
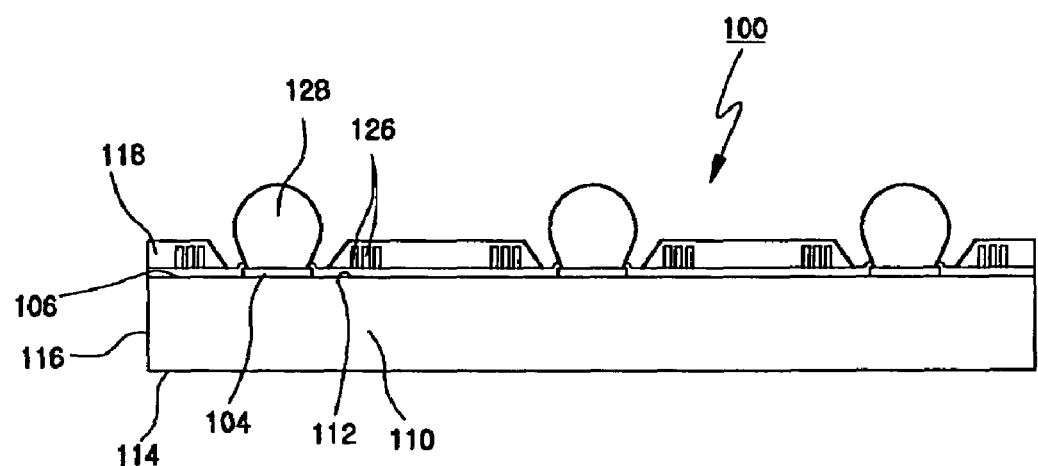
FIG. 3F is a sectional view illustrating a step following the reflow process among the manufacturing processes of a wafer-level chip-scale package according to one embodiment of the present invention.

Referring to FIG. 3F, the result following a reflow process among the manufacturing processes of a wafer-level chip-scale package according to one embodiment of the present invention is illustrated.

As shown in FIG. 3F, the wafer-level chip-scale package, in which the solder ball 128 is temporarily fixed to the flux 130, has been introduced into a furnace with a high temperature, so that the flux is eliminated when volatilized in the furnace and the solder ball 128 is re-fused in the form of an approximately circular ball inside the first aperture 108 to the surface of the metal pad 104. If the wafer-level chip-scale package is taken out from the furnace and its temperature is reduced to ambient, the solder ball 128 solidifies and is perfectly re-fused to the metal pad 104. By these processes, the method of manufacturing the wafer-level chip-scale package according to the present invention is completed.

A method for manufacturing a wafer-level chip-scale package 200 according to another embodiment of the present invention will be described in a stepwise manner with reference to FIGS. 4A through 4G. Referring to FIG. 4A through FIG. 4G, the process flow for constructing the embodiment illustrated by FIG. 2A through FIG. 2C is discussed.

Figure 4A:
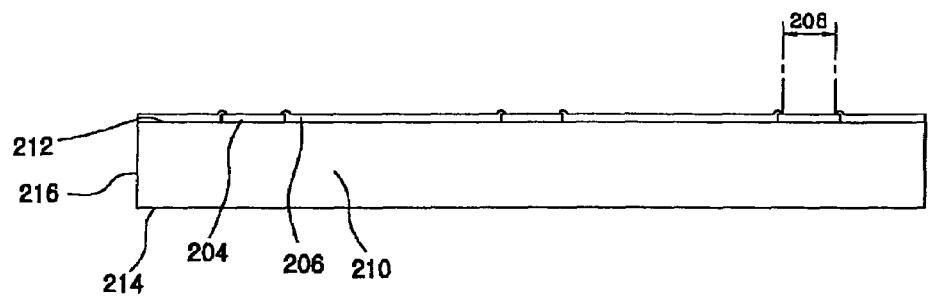
FIG. 4A is a sectional view illustrating a first protective layer-forming step among the manufacturing processes of a wafer-level chip-scale package according to another embodiment of the present invention.

Firstly, referring to FIG. 4A, a step that forms the first protective layer 206 among the manufacturing processes of a wafer-level chip-scale package according to another embodiment of the present invention is illustrated.

As shown in FIG. 4A, a semiconductor die 210 including top and bottom surfaces 212 and 214 of an approximately planar shape and a plurality of metal pads 204 formed at the top surface 212 is provided. Also, the semiconductor die 210 further comprises the first protective layer 206 of a predetermined thickness formed on the top surface 212 of the semiconductor die 110, the first protective layer 206 having first apertures 208 of a predetermined size for allowing the corresponding metal pads 204 to be opened upward.

Figure 4B:
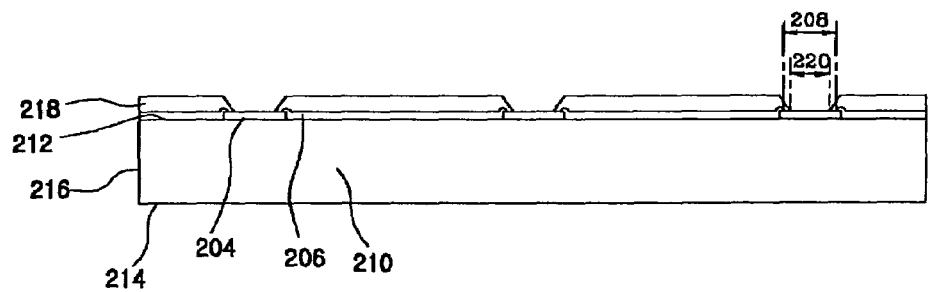
FIG. 4B is a sectional view illustrating a second protective layer-forming step among the manufacturing processes of a wafer-level chip-scale package according to another embodiment of the present invention.

Referring to FIG. 4B, a step of forming a second protective layer 218 among the manufacturing processes of a wafer-level chip-scale package according to another embodiment of the present invention is illustrated.

As shown in FIG. 4B, the second protective layer 218 of a predetermined thickness is formed on the first protective layer 206. The second protective layer 218 includes a plurality of second apertures 220 having a predetermined diameter for allowing corresponding metal pads 204 to be opened upward. After the second protective layer 218 is formed over the entire first protective layer 206, regions of the second protective layer 218 overlying corresponding metal pads 204 are etched so that the second apertures 220 of a predetermined size are formed through second protective layer 218 at the first aperture 208 of the first protective layer 212 thereby allowing the metal pads 204 to be opened upward through first apertures 208 and second apertures 220. Here, since the second protective layer 218 is formed on the top surface of the first protective layer 206, the opening size of the second aperture 220 is smaller than that of the first aperture 208.

Figure 4C:
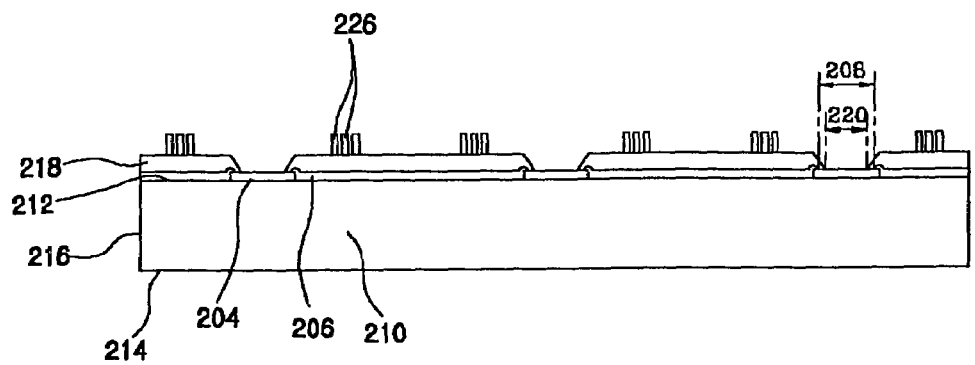
FIG. 4C is a sectional view illustrating a step of forming metal lines for a passive element among the manufacturing processes of a wafer-level chip-scale package according to another embodiment of the present invention.

Referring to FIG. 4C, a step of forming metal lines 226 for a passive element among the manufacturing processes of a wafer-level chip-scale package according to another embodiment of the present invention for implementing IPN functions is illustrated.

As shown in FIG. 4C, the plurality of metal lines 226 for passive elements (not shown) such as a resistor, inductor or capacitor is formed on the surface of the second protective layer 218. The metal lines 226 can be formed by a conventional photo etching process, after a copper (Cu) or aluminum (Al) and so forth are evaporated on the surface of the second protective layer 218. The metal lines 226 for the passive elements are connected to semiconductor die 210 directly or indirectly via the RDL metal lines (not shown), which are formed at a lower part of the first protective layer 206.

Figure 4D:
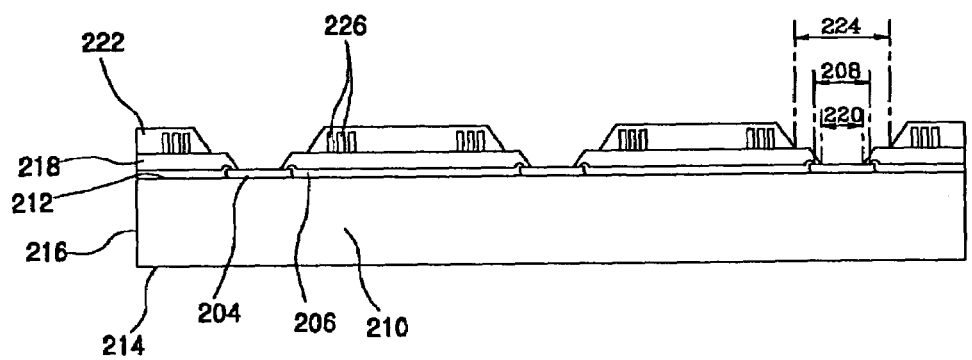
FIG. 4D is a sectional view illustrating a third protective layer-forming step among the manufacturing processes of a wafer-level chip-scale package according to another embodiment of the present invention.

Referring to FIG. 4D, a step that forms a third protective layer 222 among the manufacturing processes of a wafer-level chip-scale package according to another embodiment of the present invention is illustrated.

As shown in FIG. 4D, the third protective layer 222 of a predetermined thickness is formed on the surface of the second protective layer 218. The third protective layer 222 includes a plurality of third apertures 224 for allowing predetermined regions of corresponding metal pads 204 and the second protective layer 218 to be opened upward through first apertures 208, second apertures 220, and third apertures 224. Here, the third protective layer 222 has enough thickness to cover the metal lines 226. After the third protective layer 222 of a predetermined thickness is formed at the whole top surfaces of the second protective layer 218 and the metal pads 204, the third protective layer 222 is further formed in such a manner that predetermined regions of the third protective layer 222 overlying corresponding metal pads 104 and the second apertures 208 of the second protective layer 218. Accordingly, the plurality of metal pads 204 are exposed to the outside through the third apertures 224 of the third protective layer 222 etched in the third protective layer 222. In addition, the second protective layer 218 is exposed to the outside in an approximately circular ring shape from a plan point of view through the third aperture 224 of the third protective layer 222.

Figure 4E:
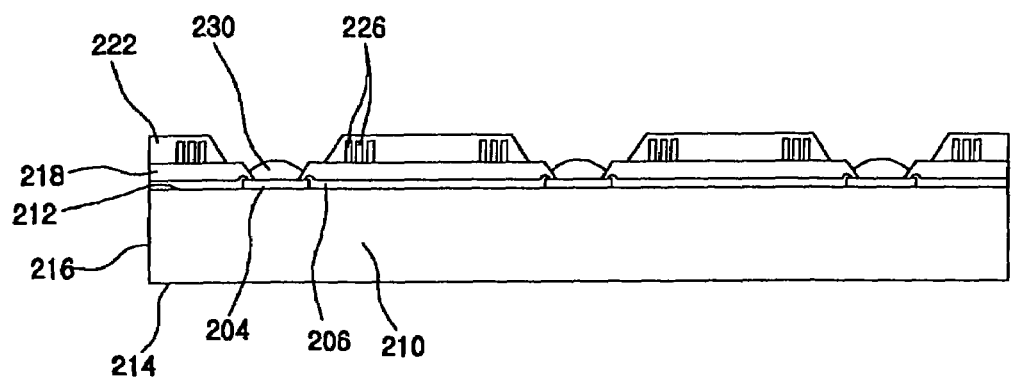
FIG. 4E is a sectional view illustrating a flux-dotting step among the manufacturing processes of a wafer-level chip-scale package according to another embodiment of the present invention.

Referring to FIG. 4E, a flux-dotting step among the manufacturing processes of a wafer-level chip-scale package according to another embodiment of the present invention is illustrated.

As shown in FIG. 4E, a uniform amount of viscous volatile flux 230 is dotted on each of the metal pads 204, which are opened to the outside through the second aperture 220 of the second protective layer 218 and third aperture 224 of the third protective layer 222. This flux dotting process is performed by a conventional dispenser, which contains the flux 230.

Figure 4F:
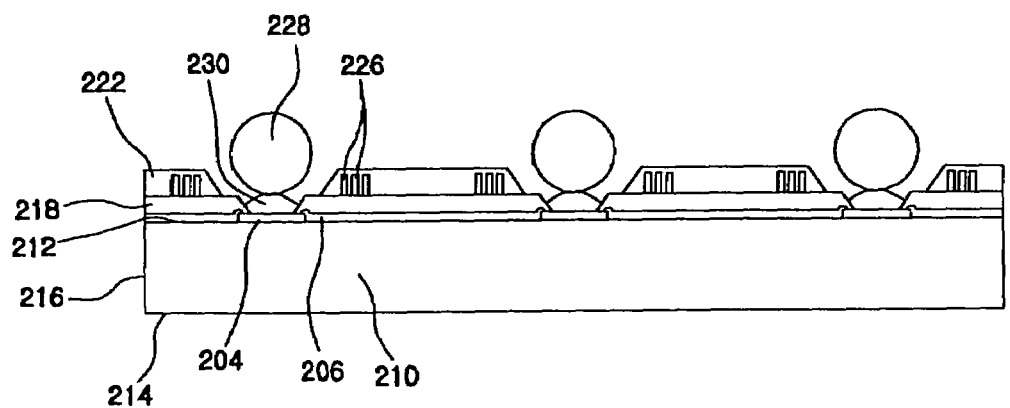
FIG. 4F is a sectional view illustrating a solder ball bumping step among the manufacturing processes of a wafer-level chip-scale package according to another embodiment of the present invention.

Referring to FIG. 4F, a solder ball 228 bumping step among the manufacturing processes of a wafer-level chip-scale package according to another embodiment of the present invention is illustrated.

As shown in FIG. 4F, a plurality of circular solder balls 228 is bumped onto the upper part of the dotted flux 230. Here, since the flux 230 in itself has viscosity, the flux temporarily fixes the solder ball 228. Also, the third aperture 224 of the third protective layer 222 is larger than the second aperture 220, thereby allowing the solder ball 228 to be guided inside the second aperture 220. Accordingly, the solder ball 228 is easily bumped on the flux 230 inside the second aperture 220, although the solder ball is bumped only loosely.

Figure 4G:
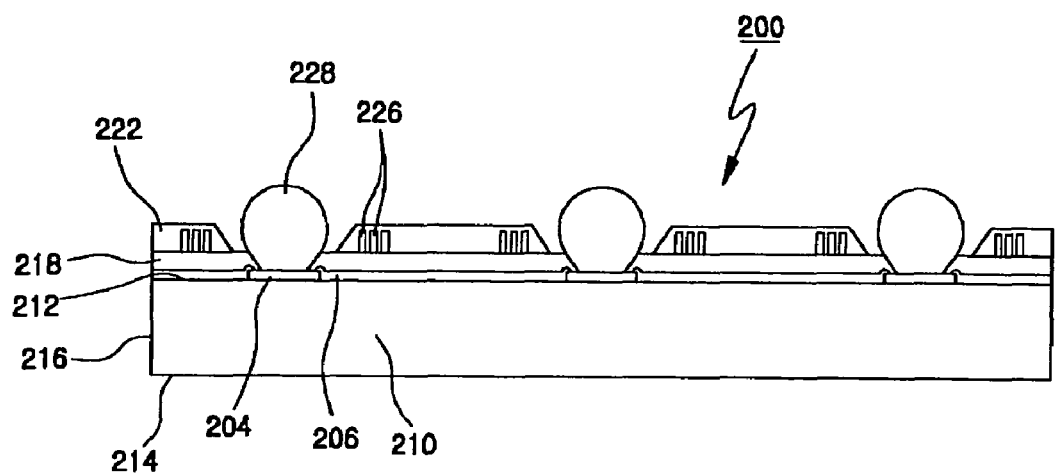
FIG. 4G is a sectional view illustrating a step after a reflow process among the manufacturing processes of a wafer-level chip-scale package according to another embodiment of the present invention.

Referring to FIG. 4G, the result after a reflow process among the manufacturing processes of a wafer-level chip-scale package according to another embodiment of the present invention is illustrated.

As shown in FIG. 4G, the wafer-level chip-scale package, in which the solder ball 228 is temporarily fixed to the flux 230, has been introduced into a furnace with a high temperature, so that the flux 230 is eliminated when volatilized in the furnace and the solder ball 228 is fused in the form of an approximately circular ball inside second aperture 220 to the surface of the metal pad 204. If the wafer-level chip-scale package is taken out from the furnace and its temperature reduced to ambient, the solder ball 228 is perfectly fused to the metal pad 204 so that it can be solidified. By these processes, the method of manufacturing the wafer-level chip-scale package according to the present invention is completed.

This disclosure provides exemplary embodiments of the present invention. The scope of the present invention is not limited by these exemplary embodiments. Numerous variations, whether explicitly provided for by the specification or implied by the specifications, such as variations in structure, dimension, type of material and manufacturing process may be implemented by one who is skilled in the art, in view of this disclosure.

What is claimed is:

1. A wafer-level chip-scale package comprising:
   a semiconductor die having top and bottom surfaces of an approximately planar shape and a plurality of metal pads formed at the top surface in an area array through a redistribution process;
   a first protective layer formed on the top surface of the semiconductor die, the first protective layer having a plurality of first apertures for allowing the metal pads to be opened upward;
   a second protective layer formed on a surface of the first protective layer, the second protective layer having a plurality of second apertures which are larger than the first apertures of the first protective layer so that regions of the metal pads and the first protective layer are opened to the outside; and
   a plurality of metal lines for passive elements formed on the surface of the first protective layer, the metal lines being covered with the second protective layer.

2. The wafer-level chip-scale package as claimed in claim 1, wherein the first protective layer is opened to the outside in an approximately circular ring shape through the second aperture of the second protective layer.

3. The wafer-level chip-scale package as claimed in claim 1, wherein the semiconductor die further comprises a side surface perpendicular to the top and bottom surfaces at their ends, the bottom and side surfaces being directly exposed to the outside.

4. The wafer-level chip-scale package as claimed in claim 1, wherein the plurality of metal pads comprise wettable surfaces.

5. A wafer-level chip-scale package comprising:
   a semiconductor die having top and bottom surfaces of an approximately planar shape and a plurality of metal pads formed at the top surface in an area array through a redistribution process;

a first protective layer formed on the top surface of the semiconductor die, the first protective layer having a plurality of first apertures for allowing the metal pads to be opened upward;

a second protective layer formed on a surface of the first protective layer, the second protective layer having a plurality of second apertures for allowing the metal pads to be opened upward;

a third protective layer formed on a surface of the second protective layer, the third protective layer having a plurality of third apertures which are larger than the second apertures of the second protective layer so that regions of the metal pads and the second protective layer are opened to the outside; and a plurality of metal lines for passive elements formed on the surface of the second protective layer, the metal lines being covered with the third protective layer.

6. The wafer-level chip-scale package as claimed in claim 5, wherein the second aperture of the second protective layer is smaller than the first aperture of the first protective layer and the third aperture of the third protective layer is larger than the first and second apertures.

7. The wafer-level chip-scale package as claimed in claim 5, wherein the second protective layer is opened to the outside in an approximately circular ring shape through the third aperture of the third protective layer.

8. The wafer-level chip-scale package as claimed in claim 5, wherein the semiconductor die further comprises a side surface perpendicular to the top and bottom surfaces at each of their ends, the bottom and side surfaces being directly exposed to the outside.

9. The wafer-level chip-scale package as claimed in claim 5, wherein the plurality of metal pads comprise wettable surfaces.

10. A wafer-level chip-scale package comprising:
a semiconductor die having a top surface and a bottom surface;
a plurality of metal pads formed at the top surface of the semiconductor die;
a first protective layer formed on the top surface of the semiconductor die, the first protective layer having a plurality of first apertures, wherein one of the plurality of first apertures overlies a corresponding one of the plurality of metal pads;
a second protective layer formed on a surface of the first protective layer, the second protective layer having a plurality of second apertures, wherein one of the plurality of second apertures overlies a corresponding one of the plurality of metal pads, and wherein the second apertures of the second protective layer are larger than the first apertures of the first protective layer; and
a plurality of metal lines for passive elements formed on the surface of the first protective layer, the metal lines being covered with the second protective layer.

11. The wafer-level chip-scale package as claimed in claim 10, wherein the plurality of metal pads comprises an area array.

12. The wafer-level chip-scale package as claimed in claim 10, wherein the plurality of metal lines for passive elements is connected to the semiconductor die via redistribution lines.

13. The wafer-level chip-scale package as claimed in claim 10, wherein the first protective layer and the second protective layer are selected from the group consisting of oxide film, nitride film, Tetra Ethyl Ortho Silicate, Benzo Cyclo Butene, and polyimide.

14. A wafer-level chip-scale package comprising:
a semiconductor die having a top surface and a bottom surface;
a plurality of metal pads formed at the top surface;
a first protective layer formed on the top surface of the semiconductor die, the first protective layer having a plurality of first apertures, wherein one of the plurality of first apertures overlies a corresponding one of the plurality of metal pads;
a second protective layer formed on a surface of the first protective layer, the second protective layer having a plurality of second apertures, wherein one of the plurality of second apertures overlies a corresponding one of the plurality of metal pads;
a third protective layer formed on a surface of the second protective layer, the third protective layer having a plurality of third apertures wherein one of the plurality of third apertures overlies a corresponding one of the plurality of metal pads, and wherein the third apertures of the third protective layer are larger than the second apertures of the second protective layer; and
a plurality of metal lines for passive elements formed on the surface of the second protective layer, the metal lines being covered with the third protective layer.

15. The wafer-level chip-scale package as claimed in claim 14, wherein the plurality of metal lines for passive elements is connected to the semiconductor die via redistribution lines.

16. The wafer-level chip-scale package as claimed in claim 14, wherein the first protective layer, the second protective layer, and the third protective layer are selected from the group consisting of oxide film, nitride film, Tetra Ethyl Ortho Silicate, Benzo Cyclo Butene, and polyimide.

17. A wafer-level chip-scale package comprising:
a semiconductor die having a top surface and a bottom surface;
a plurality of metal pads formed at the top surface of the semiconductor die;
a first protective layer formed on the top surface of the semiconductor die, the first protective layer having a plurality of first apertures for allowing the metal pads to be opened upward;
a second protective layer formed on a surface of the first protective layer, the second protective layer having a plurality of second apertures for allowing the metal pads to be opened upward, the second apertures being smaller than the first apertures; and
a third protective layer formed on a surface of the second protective layer, the third protective layer having a plurality of third apertures for allowing the second apertures of the second protective layer and the metal pads to be opened upward, the third apertures being larger than the first and second apertures.

18. The wafer-level chip-scale package as claimed in claim 17 further comprising a plurality of metal lines for passive elements formed on the surface of the second protective layer, the metal lines being covered with the third protective layer.

19. A method comprising:
providing a semiconductor die having a top surface and a bottom surface;
forming a plurality of metal pads at the top surface of the semiconductor die;
forming a first protective layer on the top surface of the semiconductor die;

etching through the first protective layer a plurality of first apertures, each of the plurality of first apertures overlying a corresponding one of the plurality of metal pads;

forming a second protective layer on a surface of the first protective layer and the metal pads;

etching through the second protective layer a plurality of second apertures, wherein each of the plurality of second apertures overlies a corresponding one of the plurality of metal pads, and wherein the second apertures of the second protective layer are larger than the first apertures of the first protective layer; and fusing one of a plurality of solder balls to a different one of the plurality of metal pads through a corresponding one of the plurality of first apertures of the first protective layer and a corresponding one of the plurality of second apertures of the second protective layer, wherein the second protective layer and each of the plurality of solder balls are separated.

20. The method of claim 19 wherein the fusing of the plurality of solder balls to the plurality of metal pads comprises:

temporarily fixing each of the plurality of solder balls to a corresponding one of the plurality of metal pads with flux;

introducing the semiconductor die into a furnace;

volatilizing the flux in the furnace; and fusing each of the plurality of solder balls to the corresponding one of the plurality of metal pads in the form of an approximately circular ball inside the second aperture.

* * * * *